United States Patent
Park et al.

(10) Patent No.: US 8,823,028 B2
(45) Date of Patent: Sep. 2, 2014

(54) LIGHT EMITTING DIODE AND METHOD OF MANUFACTURING THE SAME, AND LIGHT EMITTING DEVICE AND METHOD OF MANUFACTURING THE LIGHT EMITTING DEVICE

(75) Inventors: Jun Suk Park, Seoul (KR); Deung Kwan Kim, Seoul (KR); Han Sin, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 0 days.

(21) Appl. No.: 12/921,534

(22) PCT Filed: Jul. 21, 2009

(86) PCT No.: PCT/KR2009/004025
§ 371 (c)(1),
(2), (4) Date: Sep. 8, 2010

(87) PCT Pub. No.: WO2010/011074
PCT Pub. Date: Jan. 28, 2010

(65) Prior Publication Data
US 2011/0001161 A1  Jan. 6, 2011

(30) Foreign Application Priority Data
Jul. 21, 2008  (KR) .................. 10-2008-0070431

(51) Int. Cl.
*H01L 33/00* (2010.01)
(52) U.S. Cl.
USPC .............. 257/98; 257/79; 257/81; 257/90; 257/99; 257/103; 257/E33.033; 257/E33.065; 438/29
(58) Field of Classification Search
USPC ............. 257/79, 81, 90, 94, 98, 99, 103, 257/E33.033, E33.065; 438/29
See application file for complete search history.

(56) References Cited

U.S. PATENT DOCUMENTS

| 5,429,954 A | 7/1995 | Gerner |
| 6,797,211 B1 | 9/2004 | Guenther et al. |

(Continued)

FOREIGN PATENT DOCUMENTS

| CN | 1613156 A | 5/2005 |
| CN | 101069292 A | 11/2007 |

(Continued)

OTHER PUBLICATIONS

English machine translation of JP-2002-344027-A published Nov. 29, 2002.

(Continued)

*Primary Examiner* — Meiya Li
(74) *Attorney, Agent, or Firm* — Birch, Stewart, Kolasch & Birch, LLP

(57) ABSTRACT

A light emitting device including a conductive support substrate; an electrode layer on the conductive support substrate, and including side portions such that a center upper portion of the electrode layer protrudes upward from the conductive support substrate; a protective layer on the side portions of the electrode layer, the protective layer including an insulating material having a higher resistance than that of the electrode layer and a top surface of the protective layer is in line with a top surface of the protruding center upper portion of the electrode layer; and a light emitting structure including a second conductive semiconductor layer on the electrode layer and at least a portion of the protective layer, an active layer on the second conductive semiconductor layer and a first conductive semiconductor layer on the active layer.

15 Claims, 7 Drawing Sheets

(56) References Cited

U.S. PATENT DOCUMENTS

| | | | |
|---|---|---|---|
| 6,855,571 B1 * | 2/2005 | Sugahara et al. | 438/46 |
| 6,946,683 B2 | 9/2005 | Sano et al. | |
| 7,301,175 B2 | 11/2007 | Izuno et al. | |
| 7,365,371 B2 | 4/2008 | Andrews | |
| 7,442,254 B2 | 10/2008 | Kiyoku et al. | |
| 7,786,502 B2 | 8/2010 | Sakai | |
| 8,004,006 B2 | 8/2011 | Nakahara et al. | |
| 8,198,645 B2 | 6/2012 | Sakai | |
| 8,274,094 B2 | 9/2012 | Lee | |
| 2006/0193355 A1 | 8/2006 | Tazima et al. | |
| 2007/0029569 A1 | 2/2007 | Andrews | |
| 2008/0048202 A1 * | 2/2008 | Tazima et al. | 257/98 |
| 2008/0056322 A1 * | 3/2008 | Masui et al. | 372/45.012 |
| 2008/0084699 A1 | 4/2008 | Park et al. | |
| 2008/0142824 A1 * | 6/2008 | Chen et al. | 257/98 |
| 2008/0254557 A1 | 10/2008 | Kim et al. | |
| 2008/0308829 A1 * | 12/2008 | Liu et al. | 257/98 |
| 2009/0029499 A1 | 1/2009 | Nakahara | |
| 2009/0242913 A1 | 10/2009 | Kim et al. | |
| 2009/0294784 A1 | 12/2009 | Nakahara et al. | |
| 2011/0053297 A1 | 3/2011 | Andrews | |

FOREIGN PATENT DOCUMENTS

| | | |
|---|---|---|
| CN | 101278410 A | 10/2008 |
| CN | 101305478 A | 11/2008 |
| JP | 54-55390 A | 5/1979 |
| JP | 6-350135 A | 12/1994 |
| JP | 7-38148 A | 2/1995 |
| JP | 11-191659 A | 7/1999 |
| JP | 11-233893 A | 8/1999 |
| JP | 2002-344027 A | 11/2002 |
| JP | 2003-48134 A | 2/2003 |
| JP | 2003-504821 A | 2/2003 |
| JP | 2005-45054 A | 2/2005 |
| JP | 2006-66786 A | 3/2006 |
| JP | 2006-302965 A | 11/2006 |
| JP | 2007-165409 A | 6/2007 |
| JP | 2007-173465 A | 7/2007 |
| JP | 2007-287757 A | 11/2007 |
| JP | 2008-518436 A | 5/2008 |
| JP | 2008-263199 A | 10/2008 |
| KR | 10-059077 B1 | 6/2006 |
| KR | 10-0724782 B1 | 6/2007 |
| KR | 10-2008-0033496 A | 4/2008 |
| KR | 10-2008-0065666 A | 7/2008 |
| WO | WO 03/034508 A1 | 4/2003 |
| WO | WO 03/065464 A1 | 8/2003 |
| WO | WO 2006/062300 A1 | 6/2006 |
| WO | WO 2007/018560 A1 | 2/2007 |
| WO | WO 2007066716 A1 * | 6/2007 |
| WO | WO 2007/129847 A1 | 11/2007 |

OTHER PUBLICATIONS

English machine translation of JP-2006-302965-A published Nov. 2, 2006.

English machine translation of JP-7-38148-A published Feb. 7, 1995.

* cited by examiner

LIGHT EMITTING DIODE AND METHOD OF MANUFACTURING THE SAME, AND LIGHT EMITTING DEVICE AND METHOD OF MANUFACTURING THE LIGHT EMITTING DEVICE

TECHNICAL FIELD

The embodiment relates to a light emitting diode, a method of manufacturing the same, a light emitting device and a method of manufacturing the same.

BACKGROUND ART

Recently, alight emitting diode is extensively used as alight emitting device.

The light emitting diode includes an n type semiconductor layer, an active layer and a p type semiconductor layer. As power is applied to the n type semiconductor layer and the p type semiconductor layer, respectively, the active layer emits light. The light emitting diode can be manufactured to emit light having various colors suitable for various application fields.

The light emitting device employing the light emitting diode includes a phosphor, which is excited by light emitted from the light emitting diode so that excite light can be emitted, thereby emitting light having various colors.

For instance, a first molding member including a yellow phosphor can be formed to surround the light emitting diode that emits light having a wavelength of blue color. The yellow phosphor is excited by light emitted from the light emitting diode, thereby emitting excite light having a wavelength of yellow color.

DISCLOSURE

Technical Problem

The embodiment provides a light emitting diode, a method of manufacturing the same, a light emitting device and a method of manufacturing the same.

The embodiment provides alight emitting diode having improved insulation properties and a method of manufacturing the same.

The embodiment provides a light emitting device including a light emitting diode and a method of manufacturing the same capable of easily processing a molding member used for the light emitting device.

The embodiment provides a method of manufacturing a light emitting device, capable of simultaneously processing molding members for a plurality of light emitting devices.

Technical Solution

A light emitting device according to an embodiment includes a circuit board formed with a first conductive pattern and a second conductive pattern electrically isolated from the first conductive pattern; a light emitting diode electrically connected to the first and second conductive patterns on the circuit board; a first molding member surrounding the light emitting diode; and a second molding member on the first molding member, wherein the light emitting diode includes a conductive support substrate, a reflective electrode layer having a convex center portion on the conductive support substrate, a protective layer on a peripheral portion of the reflective electrode layer, a second conductive semiconductor layer on the reflective layer and the protective layer, an active layer on the second conductive semiconductor layer, a first conductive semiconductor layer on the active layer, and a first electrode layer on the first conductive semiconductor layer.

A method of manufacturing a light emitting device according to an embodiment includes forming a light emitting diode on a circuit board; forming a first molding member on the circuit board such that the first molding member surrounds the light emitting diode; forming a second molding member on the first molding member and performing a preliminary curing process; and providing a pressing member to deform a shape of the second molding member and performing a main curing process.

A light emitting diode according to an embodiment includes a conductive support substrate; a reflective electrode layer having a convex center portion on the conductive support substrate; a protective layer on a peripheral portion of the reflective electrode layer; a second conductive semiconductor layer on the reflective layer and the protective layer; an active layer on the second conductive semiconductor layer; a first conductive semiconductor layer on the active layer; and a first electrode layer on the first conductive semiconductor layer.

Advantageous Effects

The embodiment can provide a light emitting diode, a method of manufacturing the same, a light emitting device and a method of manufacturing the same.

The embodiment can provide a light emitting diode having improved insulating properties and a method of manufacturing the same.

The embodiment can provide a light emitting device including a light emitting diode having improved insulating properties and a method of manufacturing the same capable of easily processing a molding member used for the light emitting device.

The embodiment can provide a method of manufacturing a light emitting device, capable of simultaneously processing molding members for a plurality of light emitting devices.

BEST MODE

Figure 1:
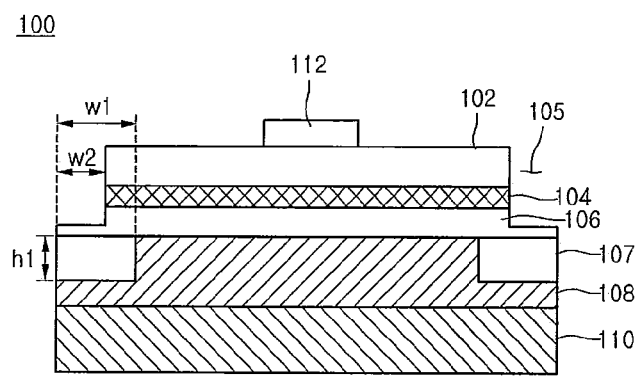
FIG. 1 is a sectional view showing a light emitting diode according to an embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings can be exaggerated, omitted or schematically drawn for the purpose of convenience or clarity. In addition, the size of elements does not utterly reflect an actual size.

Hereinafter, a light emitting diode, a method of manufacturing the same, a light emitting device and a method of manufacturing the same according to embodiments of the present invention will be described in detail with reference to the accompanying drawings.

FIG. 1 is a sectional view showing a light emitting diode according to an embodiment.

Referring to FIG. 1, the light emitting diode 100 includes a first conductive semiconductor layer 102, an active layer 104, a second conductive semiconductor layer 106, a protective layer 107, a reflective electrode layer 108, and a conductive support substrate 110. In addition, a first electrode layer 112 is formed on the first conductive semiconductor layer 102.

The first conductive semiconductor layer 102 may include an n type semiconductor layer. The n type semiconductor layer may include a GaN based compound semiconductor layer, such as a GaN layer, an AlGaN layer or an InGaN layer.

The active layer 104 is formed under the first conductive semiconductor layer 102. The active layer 104 may have a single quantum well structure or a multiple quantum well structure. For instance, the active layer 104 may have a single quantum well structure or a multiple quantum well structure including InGaN well/GaN barrier layers. In the $In_xGa_{1-x}N$ well layer, x is in the range of $0 \le x \le 1$.

The second conductive semiconductor layer 106 is formed under the active layer 104. The second conductive semiconductor layer 106 may include a p type semiconductor layer. The p type semiconductor layer may include a GaN based compound semiconductor layer, such as a GaN layer, an AlGaN layer or an InGaN layer into which p type impurities, such as Mg, are implanted.

In addition, a third conductive semiconductor layer (not shown) can be formed under the second conductive semiconductor layer 106. The third conductive semiconductor layer may include an n type semiconductor layer.

According to another embodiment, the first conductive semiconductor layer 102 may include the p type semiconductor layer and the second conductive semiconductor layer 106 may include the n type semiconductor layer.

The protective layer 107 and the reflective electrode layer 108 are formed under the second conductive semiconductor layer 106.

The reflective electrode layer 108 makes contact with the center of a bottom surface of the second conductive semiconductor layer 106, and the protective layer 107 makes contact with the peripheral portion of the bottom surface of the second conductive semiconductor layer 106.

The protective layer 107 makes contact with a top surface and side surfaces of the reflective electrode layer 108.

The protective layer 107 may increase a longitudinal interval between a lateral side of the reflective electrode layer 108 or the conductive support layer 110 and the first electrode layer 112 or the first conductive semiconductor layer 102.

Thus, the reflective electrode layer 108 or the conductive support substrate 110 can be prevented from being electrically shorted from the first electrode layer 112 or the first conductive semiconductor layer 102 by foreign substance.

The protective layer 107 having a predetermined height h1 and a predetermined width w1 is formed under a peripheral portion of the second conductive semiconductor layer 106. The protective layer 107 may include a semiconductor layer which is equal to or different from the second conductive semiconductor layer 106. In addition, the protective layer 107 may include an insulating layer.

In detail, the protective layer has the width w1 of about 20 to 600 μm and the height h1 of 5 to 500 μm on the basis of the second conductive semiconductor layer 106. In addition, the protective layer 107 may include one of an n type semiconductor layer, a p type semiconductor layer and an undoped semiconductor layer. The protective layer 107 can be prepared as a stack structure including at least two of the n type semiconductor layer, the p type semiconductor layer and the undoped semiconductor layer. For instance, the protective layer 107 may include at least one of an n type GaN layer, a p type GaN layer, and an undoped GaN layer. The protective layer 107 may include the p type GaN layer identical to the second conductive semiconductor layer 106.

An etching groove 105, which is formed by mesa-etching predetermined portions of the first conductive semiconductor layer 102 and the second conductive semiconductor layer 106 such that the protective layer 107 can be partially exposed through the etching groove 105, may increase the horizontal interval between a lateral side of the reflective electrode layer 108 or the conductive support layer 110 and the first electrode layer 112 or the first conductive semiconductor layer 102.

Therefore, the reflective electrode layer 108 or the conductive support substrate 110 can be prevented from being electrically shorted from the first electrode layer 112 or the first conductive semiconductor layer 102 by foreign substance.

The etching groove 105 may have a width w2 of about 10 to 500 μm. The width w2 of the etching groove 105 is smaller than the width w1 of the protective layer 107 (w1>w2).

If the width w2 of the etching groove 105 is equal to or greater than the width w1 of the protective layer 107, the reflective electrode layer 108 may be exposed upward due to the mesa etching.

The conductive support substrate 110 is formed under the reflective electrode layer 108.

The reflective electrode layer 108 may serve as a p type electrode having an ohmic contact function so stably supply external current. The p type electrode may include at least one of Ag, Ni, Al, Rh, Pd, Ir, Ru, Mg, Zn, Pt, Au and Hf. The conductive support substrate 110 may include Cu or Au.

In the light emitting diode according to the embodiment, the reflective electrode layer 108 and the conductive support substrate 110 may serve as a second electrode layer for supplying power to the second conductive semiconductor layer 106 in correspondence with the first electrode layer 112 for supplying power to the first conductive semiconductor layer 102.

A center portion of the top surface of the second electrode layer protrudes upward relative to a peripheral portion of the top surface of the second electrode layer. According to the embodiment, the center portion of the reflective electrode layer 108 protrudes upward relative to the peripheral portion of the reflective electrode layer 108.

Since the center portion of the top surface of the second electrode layer protrudes upward relative to the peripheral portion of the top surface of the second electrode layer, the electric insulation property of the light emitting diode can be improved. The protective layer 107 may be selectively formed.

FIGS. 2 to 9 are views showing a method of manufacturing the light emitting diode according to the embodiment.

Figure 2:
FIGS. 2 to 9 are views showing a method of manufacturing a light emitting diode according to an embodiment.
Figure 3:
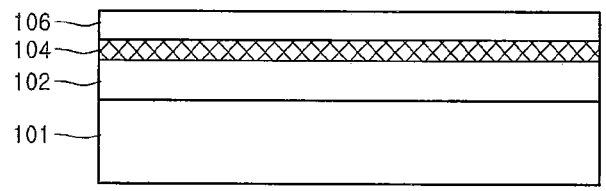

Referring to FIGS. 2 and 3, the first conductive semiconductor layer 102 is formed on the substrate 101, the active layer 104 is formed on the first conductive semiconductor layer 102, and the second conductive semiconductor layer 106 is formed on the active layer 104. The first conductive semiconductor layer 102 may include the n type semiconductor layer, and the second conductive semiconductor layer 106 may include the p type semiconductor layer, or vice versa.

Figure 4:
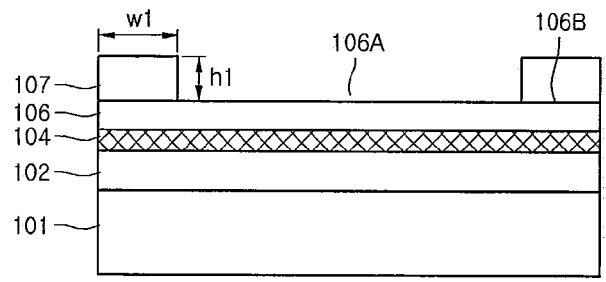

Referring to FIG. 4, an oxide layer pattern (for instance $SiO_2$) (not shown) is formed on a center portion 106A of the second conductive semiconductor layer 106 and then the protective layer 107 having a predetermined height h1 and a predetermined width w1 is formed on a peripheral portion 106B of the second conductive semiconductor layer 106 by using the oxide layer pattern as a mask.

The protective layer 107 may include one of an n type GaN layer, a p type GaN layer and an undoped GaN layer. The protective layer 107 can be prepared as a stack structure including at least two of the n type GaN layer, the p type GaN layer and the undoped GaN layer. The protective layer 107 may include an insulating layer. For instance, the undoped GaN layer can be formed by supplying $NH_3$ and TMGa gas at the growth temperature of about 900° C.

The protective layer 107 may have a width w1 of about 20 to 600 μm and a height h1 of about 5 to 500 μm.

After the protective layer 107 has been formed, the oxide layer pattern is removed from the center portion of the second conductive semiconductor layer 106.

Figure 5:
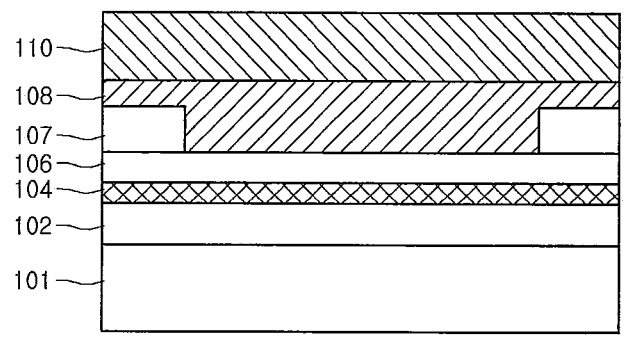

Referring to FIG. 5, the reflective electrode layer 108 is formed on the second conductive semiconductor layer 106 and the protective layer 107, and the conductive support substrate 110 is formed on the reflective electrode layer 108.

Figure 6:
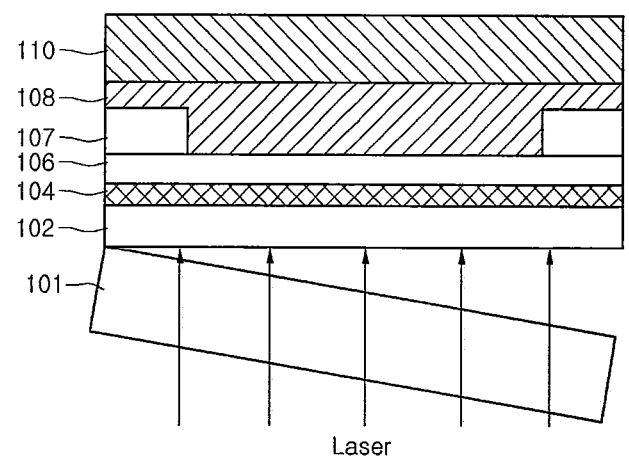
Figure 7:
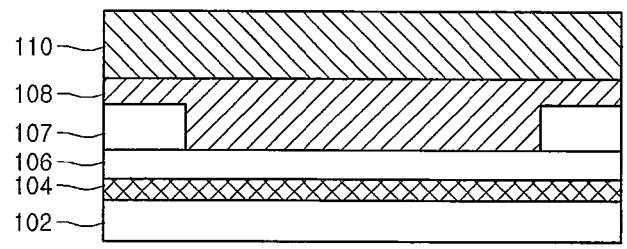

Referring to FIGS. 6 and 7, the substrate 101 formed under the first conductive semiconductor layer 102 is removed through a laser liftoff (LLO) process. That is, laser having a predetermined wavelength band is irradiated onto the substrate 101, so that thermal energy is concentrated onto a boundary surface between the substrate 101 and the first conductive semiconductor layer 102, thereby separating the substrate 101 from the first conductive semiconductor layer 102.

After the substrate 101 has been removed, the surface of the first conductive semiconductor layer 102 is polished through an inductively coupled plasma/reactive ion etching (ICP/RIE) process.

Figure 8:
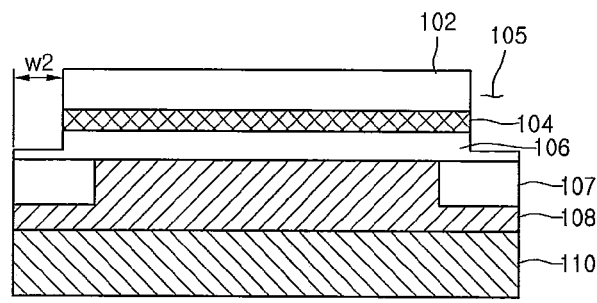

Referring to FIG. 8, the resultant structure, in which the substrate 101 is removed, is turned over such that the conductive support substrate 110 can be placed below the light emitting structure.

In addition, the mesa etching is performed from the first conductive semiconductor layer 102 to the second conductive semiconductor layer 106, thereby forming the etching groove 105. The mesa etching may include dry etching or wet etching. The mesa etching may be continued until the second conductive semiconductor layer 106 or the protective layer 107 is partially exposed. Thus, the etching groove 105 ranging from the first conductive semiconductor layer 102 to the second conductive semiconductor layer 106 can be formed.

The etching groove 105 has a width w2 of about 10 to 500 μm, which is smaller than a width w1 of the protective layer 107 (see, FIG. 4).

Figure 9:
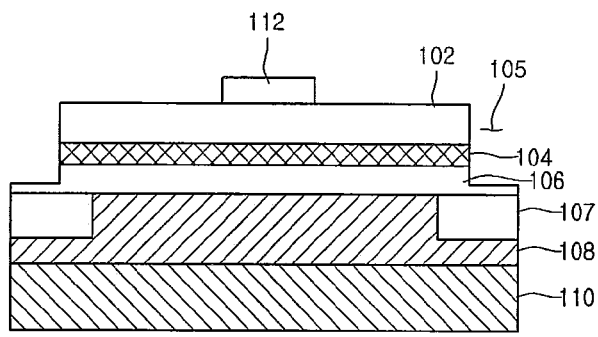

Referring to FIG. 9, the first electrode layer 112 is formed on the first conductive semiconductor layer 102. The first electrode layer 112 may include a transparent electrode layer or a transparent layer can be formed between the first electrode layer 112 and the first conductive semiconductor layer 102.

The light emitting diode 100 according to the embodiment includes the protective layer 107 and the etching groove 105, so that the light emitting diode 100 can be prevented from being electrically shorted due to foreign substance.

Thus, insulation properties of the light emitting diode 100 can be improved.

Figure 10:
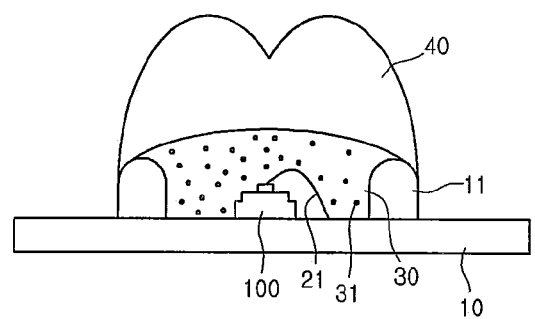
FIG. 10 is a view showing a light emitting device including a light emitting diode according to an embodiment.

FIG. 10 is a view showing a light emitting device including a light emitting diode according to the embodiment.

Referring to FIG. 10, the light emitting device according to the embodiment includes a circuit board 10 having a first conductive pattern (not shown) and a second conductive pattern (not shown) spaced apart from the first conductive pattern, a light emitting diode 100 electrically connected to the circuit board 10 through a wire 21, a guide ring 11 disposed around the light emitting diode 100 on the circuit board 10, a first molding member 30 supported by the guide ring 11 and including a phosphor 31, and a second molding member 40 formed on the first molding member 30.

As shown in FIGS. 9 and 10, the conductive support substrate 110 of the light emitting diode 100 is electrically connected to the first conductive pattern formed on the circuit board 10, and the first electrode layer 112 of the light emitting diode 100 is electrically connected to the second conductive pattern, which is electrically isolated from the first conductive pattern, through the wire 21.

The first molding member 30 surrounds the light emitting diode 100 in such a manner that the phosphor 31 of the first molding member 30 can be excited by light emitted from the light emitting diode 100. The phosphor 31 is distributed in the first molding member 30. According to another embodiment, the first molding member 30 can be omitted. In this case, the second molding member 40 may include the region for the first molding member 30.

The second molding member 40 is formed on the first molding member 30 to decide the distribution characteristic of light emitted from the light emitting diode 100.

According to the light emitting device of the embodiment, the second molding member 40 has a convex top surface and the center of the convex top surface subsides.

Figure 11:
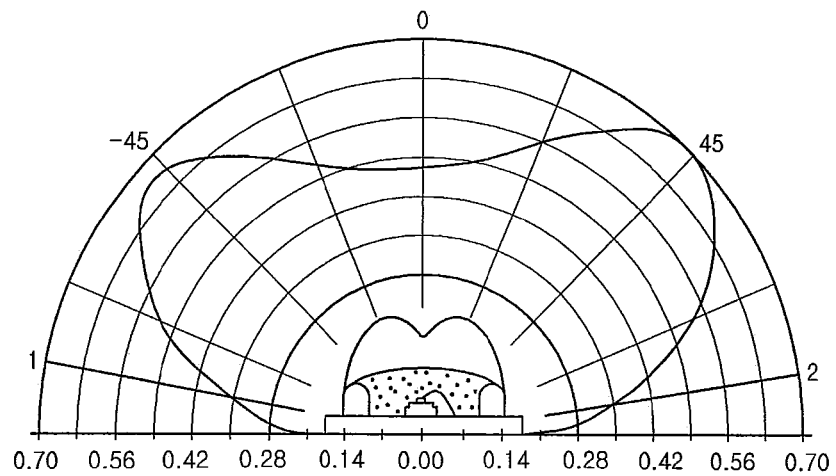
FIG. 11 is a view showing a light distribution characteristic of a light emitting device according to an embodiment.

FIG. 11 is a view showing the light distribution characteristic of the light emitting device according to the embodiment.

As shown in FIG. 11, the light distribution characteristic of the light emitting device may vary depending on the configuration of the second molding member 40 serving as a lens. According to the embodiment, the second molding member 40 has a convex configuration as a whole and the center of the second molding member 40 subsides in such a manner that the light emitting device may emit the light at an angle of 45°.

Such a light emitting device can be suitably used as a backlight unit for a display device.

FIGS. 12 to 19 are views showing a method of manufacturing a light emitting device according to an embodiment.

Figure 12:
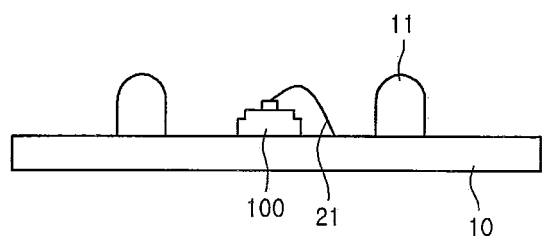
FIGS. 12 to 19 are views showing a method of manufacturing a light emitting device according to an embodiment.

Referring to FIG. 12, the guide ring 11 and the light emitting diode 100 are installed on the circuit board 10. At this time, the light emitting diode 100 is disposed such that the conductive support substrate 110 of the light emitting diode 100 can make contact with the first conductive pattern of the circuit board 10. In addition, the first electrode layer 112 of the light emitting diode is electrically connected to the second conductive pattern of the circuit board 10 through the wire 21.

Figure 13:
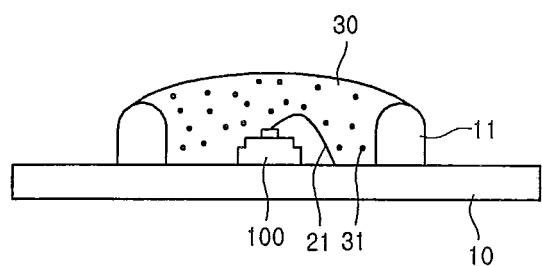

Referring to FIG. 13, the first molding member 30 including the phosphor 31 is formed on the circuit board 10 having the light emitting diode 100 in such a manner that the first molding member 30 may surround the light emitting diode 100. The first molding member 30 is supported by the guide ring 11 and has a thickness sufficient for covering the light emitting diode 100.

Figure 14:
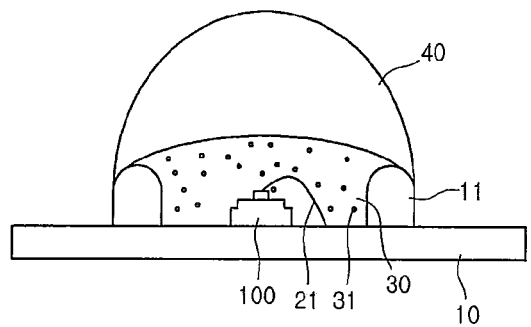

Referring to FIG. 14, the second molding member 40 including resin material, such as silicone, is formed on the first molding member 30. The second molding member 40 decides the distribution characteristic of light emitted from the light emitting diode 100. Primarily, the second molding member 40 is formed in a convex configuration and is subject to a preliminary curing process.

For instance, the preliminary curing process can be performed for 5 to 15 minutes at the temperature of 40 to 80° C.

Figure 15:
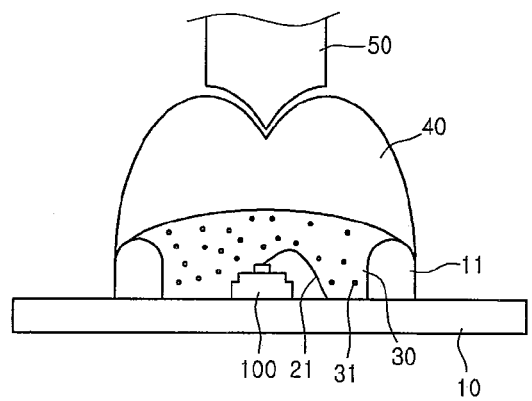
Figure 16:
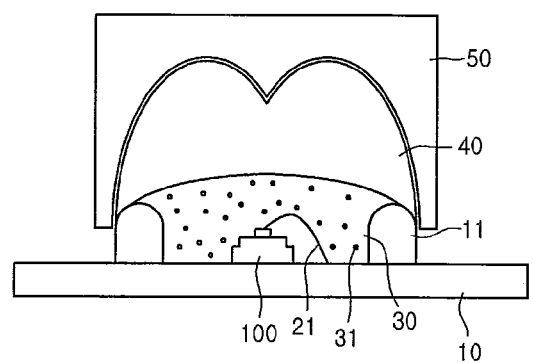

Referring to FIG. 15, after the preliminary curing process has been performed, the second molding member 40 is pressed by a pressing member 50. FIG. 16 shows a pressing member 50 according to another embodiment.

As shown in FIGS. 15 and 16, the main curing process is performed in a state in which the second molding member 40 is pressed by the pressing member 50.

For instance, the main curing process can be performed for 5 to 15 minutes at the temperature of 130 to 170° C.

The light emitting device as shown in FIG. 10 can be obtained after the preliminary and main curing processes have been completed.

Meanwhile, according to the method of manufacturing the light emitting device of the embodiment, the second molding members 40 of plural light emitting devices formed on the circuit board 10 can be simultaneously processed, so that productivity can be improved.

Figure 17:
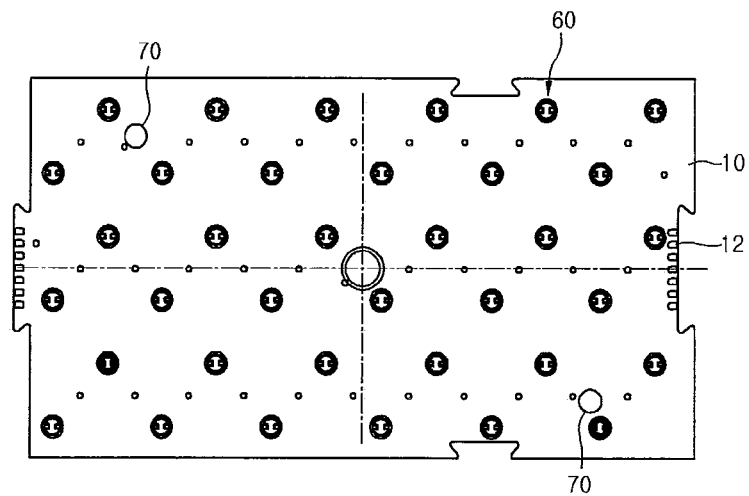

Referring to FIG. 17, a plurality of light emitting devices 60 formed with second molding members 40 as shown in FIG. 14 are provided on the circuit board 10 having conductive patterns (not shown) and terminals 12 for supplying power to the conductive patterns.

Guide pin insertion holes 70 can be formed in the circuit board 10.

Figure 18:
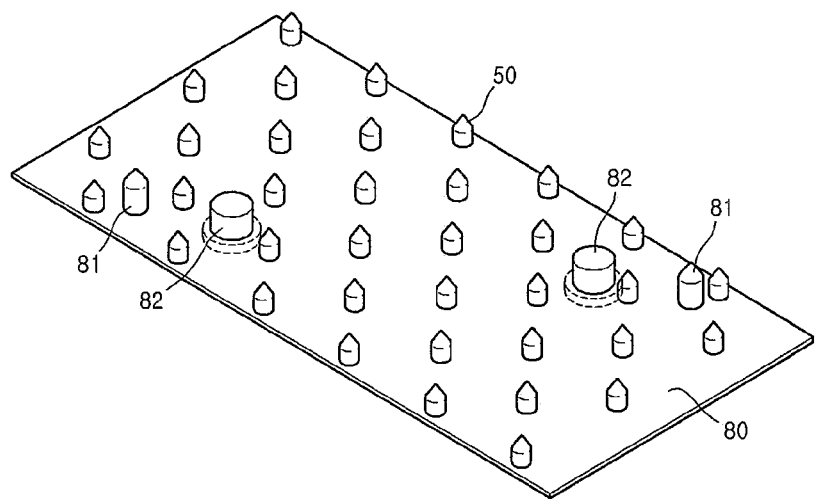

Meanwhile, a molding board 80 shown in FIG. 18 has a size identical to that of the circuit board 10. Guide pins 81 are provided on the molding board 80. The guide pins 81 are inserted into the guide pin insertion holes 70 to precisely align the circuit board 10 and the molding board 80. Spacer members 82 are provided on the molding board 80 such that the circuit board 10 can be spaced apart from the molding board 80 by a predetermined distance. Pressing members 50 are provided on the molding board 80 corresponding to the light emitting devices 60 in order to press the second molding members 40 of the light emitting devices 60.

The molding member 50 shown in FIG. 18 is identical to the molding member 50 shown in FIG. 15. In addition, various types of molding members can be used depending on the shape of the second molding members 40.

Figure 19:
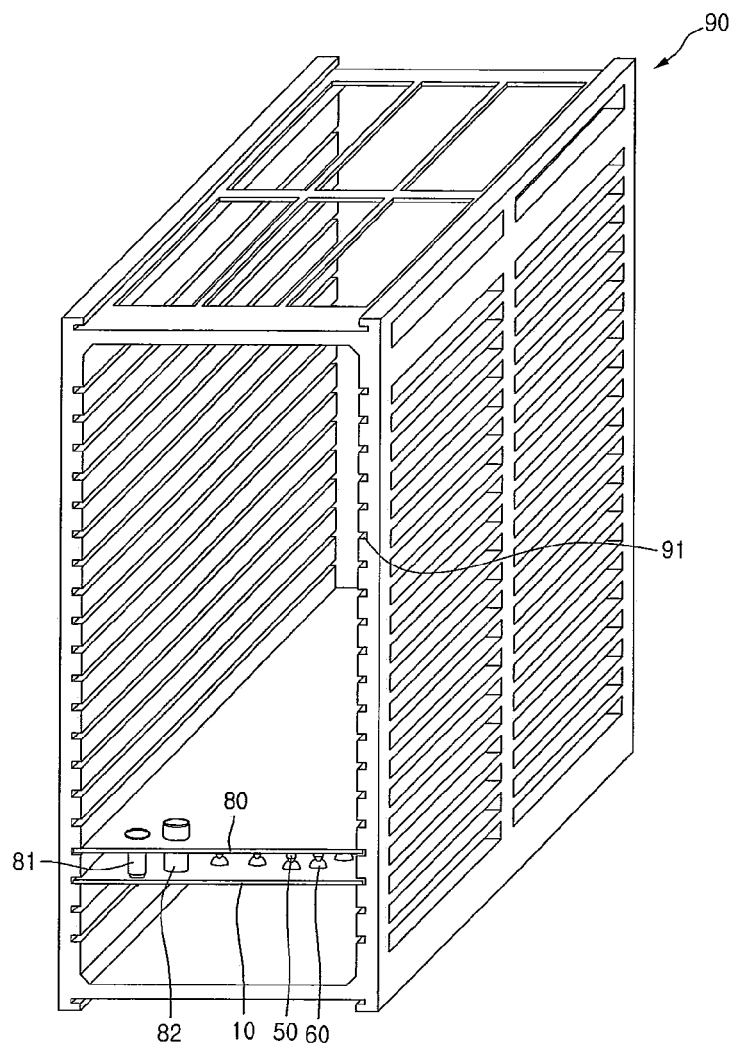

As shown in FIG. 19, in a state in which the circuit board 10 and the molding board 80 are aligned in opposition to each other, a magazine 90 having a plurality of horizontal slots 91 are fitted with the circuit board 10 and the molding board 80.

At this time, the guide pins 81 are inserted into the guide pin insertion holes 70 of the circuit board 10 so that the circuit board 10 and the molding board 80 can be prevented from being shaken in the horizontal direction. The circuit board 10 can be spaced apart from the molding board 10 corresponding to an interval between slots 91 of the magazine 90 by the spacer members 82. For the purpose of explanation, the position of the guide pins 81 and the spacer members 82 shown in FIG. 18 is different from the position of the guide pins 81 and the spacer members 82 shown in FIG. 19. The number and position of the guide pins 81 and the spacer members 82 may vary depending on applications thereof.

As shown in FIG. 19, the main curing process is performed with respect to the light emitting devices 60 in a state in which the circuit board 10 is assembled with the molding board 80.

Thus, the second molding members 40 can be simultaneously processed for the light emitting devices 60 formed in the circuit board 10.

Meanwhile, since a plurality of circuit boards 10 and molding boards 80 can be fitted with the magazine 90 corresponding to the number of slots 91 formed in the magazine 90, the second molding members 40 can be simultaneously processed for the light emitting devices 60 formed in the plural circuit boards 10.

According to the method of manufacturing the light emitting device of the embodiment, the molding member of the light emitting device can be easily processed and the molding members can be simultaneously processed for the plural light emitting devices.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

INDUSTRIAL APPLICABILITY

The embodiment is applicable in a light emitting diode, a method of manufacturing the same, a light emitting device and a method of manufacturing the same.

The invention claimed is:

1. A light emitting diode includes:
a conductive support substrate;
a second electrode layer on the conductive support substrate and including a center portion and a peripheral portion surrounding the center portion;
a protective layer on the peripheral portion of the electrode layer;
a light emitting structure including a second conductive semiconductor layer on the second electrode layer, an active layer on the second conductive semiconductor layer and a first conductive semiconductor layer on the active layer; and
a first electrode layer on the first conductive semiconductor layer,
wherein the center portion has a thickness different from that of the peripheral portion,
wherein the protection layer is directly in contact with the second conductive semiconductor layer, and
wherein the second conductive semiconductor layer includes edge portions extending outside of the light emitting structure, the edge portions are exposed upward and aligned with respective edges of the protective layer.

2. The light emitting device according to claim 1, wherein a bottom surface of the second conductive semiconductor layer contacts the second electrode layer.

3. The light emitting device according to claim 1, wherein the protective layer fills side portions of the second electrode layer and surrounds the second electrode layer.

4. The light emitting device according to claim 1, wherein the second electrode layer serves as a p type electrode.

5. The light emitting device according to claim 4, wherein the second electrode layer includes at least one of Ag, Ni, Al, Pt, and Au.

6. The light emitting device according to claim 1, wherein the conductive support substrate includes at least one of Cu and Au.

7. The light emitting device according to claim 1, wherein the center portion of the second electrode layer has a narrower width than that of the second conductive semiconductor layer.

8. The light emitting device according to claim 1, wherein the center portion of the second electrode layer overlaps the active layer vertically.

9. The light emitting device according to claim 1, wherein the center portion of the second electrode layer has a thickness greater than that of side portions of the second electrode layer.

10. The light emitting device according to claim 1, wherein a width of the center portion of the second electrode layer is greater than a width of a top surface of the peripheral portion.

11. The light emitting device according to claim 1, wherein the protective layer makes contact with a top surface and a side surface of the peripheral portion.

12. The light emitting device according to claim 1, wherein a top surface of the center portion of the second electrode layer is in line with a top surface of the protective layer.

13. A light emitting device comprising:
a substrate formed with a first conductive pattern and a second conductive pattern isolated from the first conductive pattern;
a light emitting diode electrically connected to the first conductive pattern and the second conductive pattern on the substrate;
a guide ring surrounding the light emitting diode;
a first molding member in the guide ring; and
a second molding member on the first molding member,
wherein the light emitting diode includes:
a conductive support substrate;
an electrode layer on the conductive support substrate and including a center portion and a peripheral portion surrounding the center portion;
a protective layer on the peripheral portion of the electrode layer;
a second conductive semiconductor layer on the electrode layer;
an active layer on the second conductive semiconductor layer; a first conductive semiconductor layer on the active layer; and a first electrode layer on the first conductive semiconductor layer, wherein the center portion has a thickness different from that of the peripheral portion,
wherein the protection layer is directly in contact with the second conductive semiconductor layer, and
wherein the second conductive semiconductor layer includes edge portions extending outside of the light emitting structure, the edge portions are exposed upward and aligned with respective edges of the protective layer.

14. The light emitting device as claimed in claim 13, wherein the first molding member further includes a phosphor.

15. A light emitting diode comprising: a conductive support substrate;
a reflective electrode layer on the conductive support substrate and including a center portion and a peripheral portion surrounding the center portion;
a protective layer on the peripheral portion of the reflective electrode layer; a second conductive semiconductor layer on the reflective layer; an active layer on the second conductive semiconductor layer; a first conductive semiconductor layer on the active layer; and a first electrode layer on the first conductive semiconductor layer,
wherein at least a portion of the peripheral portion of the reflective electrode layer directly contacts the protective layer,
wherein the center portion has a thickness different from that of the peripheral portion,
wherein the protection layer is directly in contact with the second conductive semiconductor layer, and
wherein the second conductive semiconductor layer includes edge portions extending outside of the light emitting structure, the edge portions are exposed upward and aligned with respective edges of the protective layer.

* * * * *